US012751019B2

(12) United States Patent
Lin et al.

(10) Patent No.: US 12,751,019 B2
(45) Date of Patent: Sep. 29, 2026

(54) SEMICONDUCTOR DEVICE AND A METHOD FOR MANUFACTURING THE SAME

(71) Applicant: MACRONIX INTERNATIONAL CO., LTD., Hsinchu (TW)

(72) Inventors: Yu-Yu Lin, New Taipei City (TW); Feng-Min Lee, Hsinchu City (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 842 days.

(21) Appl. No.: 18/153,376

(22) Filed: Jan. 12, 2023

(65) Prior Publication Data

US 2024/0244849 A1 Jul. 18, 2024

(51) Int. Cl.
*H10B 63/00* (2023.01)
*H10N 70/00* (2023.01)
*H10N 70/20* (2023.01)

(52) U.S. Cl.
CPC ........... *H10B 63/80* (2023.02); *H10N 70/011* (2023.02); *H10N 70/24* (2023.02); *H10N 70/826* (2023.02)

(58) Field of Classification Search
CPC ..... H10N 70/826; H10N 70/24; H10N 70/011
See application file for complete search history.

(56) References Cited

U.S. PATENT DOCUMENTS

| | | | | |
|---|---|---|---|---|
| 10,134,870 | B2 * | 11/2018 | Ching .................. | H10D 64/015 |
| 10,665,691 | B2 * | 5/2020 | Ching .................. | H10D 64/015 |
| 2007/0235709 | A1 | 10/2007 | Kostylev et al. | |
| 2024/0244849 | A1 * | 7/2024 | Lin ...................... | H10N 70/826 |

* cited by examiner

*Primary Examiner* — Mark V Prenty
(74) *Attorney, Agent, or Firm* — McClure, Qualey & Rodack, LLP

(57) ABSTRACT

A semiconductor device includes a resistor. The resistor includes two bottom electrodes adjacent to each other, a resistive layer, a top electrode and a conductive sidewall. The resistive layer is disposed on the two bottom electrodes. The top electrode is disposed on the resistive layer. The conductive sidewall surrounds the top electrode and is electrically connected to the top electrode and a bottom electrode of the two bottom electrodes. The top electrode overlaps the two bottom electrodes in the first direction, and extends above the two bottom electrodes along a second direction different from the first direction.

14 Claims, 10 Drawing Sheets

SEMICONDUCTOR DEVICE AND A METHOD FOR MANUFACTURING THE SAME

BACKGROUND OF THE INVENTION

Field of the Invention

The invention relates in general to a semiconductor device and a method for manufacturing the semiconductor device, and more particularly to a resistive memory device and a method for manufacturing the resistive memory device.

Description of the Related Art

Recently, human demands for semiconductor devices continue to increase. Among semiconductor devices, there is an emerging technology of resistive memory devices. Resistive memory devices operate by changing the resistance of the memory material, and the resistance can be read and written to indicate the stored data. However, there is still a need for further improvement in the structure and manufacturing method of the current resistive memory device.

SUMMARY OF THE INVENTION

The invention is directed to a semiconductor device and a method for manufacturing the semiconductor device, which can save manufacturing time and cost.

According to an embodiment of the present invention, a semiconductor device is provided. The semiconductor device includes at least one resistor. The resistor includes two bottom electrodes adjacent to each other, a resistive layer, a top electrode and a conductive sidewall. The resistive layer is disposed on the two bottom electrodes. The top electrode is disposed on the resistive layer. The conductive sidewall surrounds the top electrode and is electrically connected to the top electrode and a bottom electrode of the two bottom electrodes. The top electrode overlaps the two bottom electrodes in the first direction, and extends above the two bottom electrodes along a second direction different from the first direction.

According to another embodiment of the present invention, a method for manufacturing a semiconductor device is provided. The method includes forming at least one resistor. The method for forming the at least one resistor includes the following steps: forming two bottom electrodes adjacent to each other; forming a resistive layer disposed on the two bottom electrodes; forming a top electrode disposed on the resistive layer, and forming a conductive sidewall, wherein the conductive sidewall surrounds the top electrode and is electrically connected to the top electrode and a bottom electrode of the two bottom electrodes. The top electrode overlaps the two bottom electrodes in the first direction, and extends above the two bottom electrodes along a second direction different from the first direction.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1A:
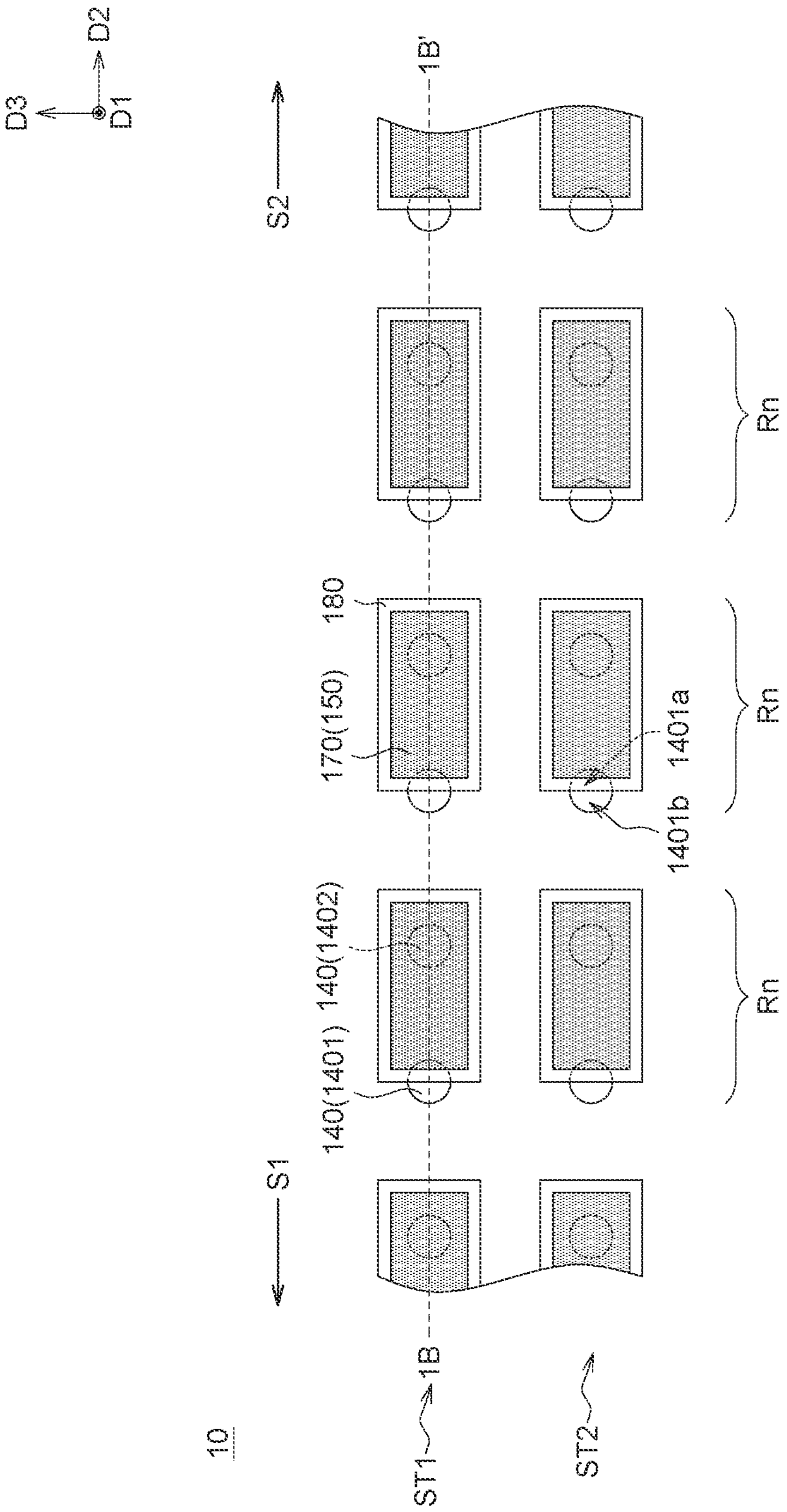
FIG. 1A shows a top view of a semiconductor device according to an embodiment of the present invention.

The detailed description of the invention provides a semiconductor device and a method for manufacturing the semiconductor device, which can form a resistor string with a more concise manufacturing process and structure, so as to save time and cost. In order to make the above-mentioned embodiment and other objectives, features and advantages of the detailed description of the invention more comprehensible, a semiconductor device and a method for manufacturing the semiconductor device are specifically described as a preferred embodiment below, and described in detail with the accompanying drawings.

However, it should be noted that these specific embodiments and methods are not intended to limit the present invention. The invention can still be implemented with other features, elements, methods and parameters. The proposal of the preferred embodiment is only used to illustrate the technical features of the present invention, and is not intended to limit the patent scope of the present invention. One of ordinary skill in the art will be able to make equivalent modifications and changes according to the descriptions in the following specification without departing from the spirit of the present invention. In different embodiments and drawings, the same or similar elements will be denoted by the same or similar reference numerals.

Figure 1B:
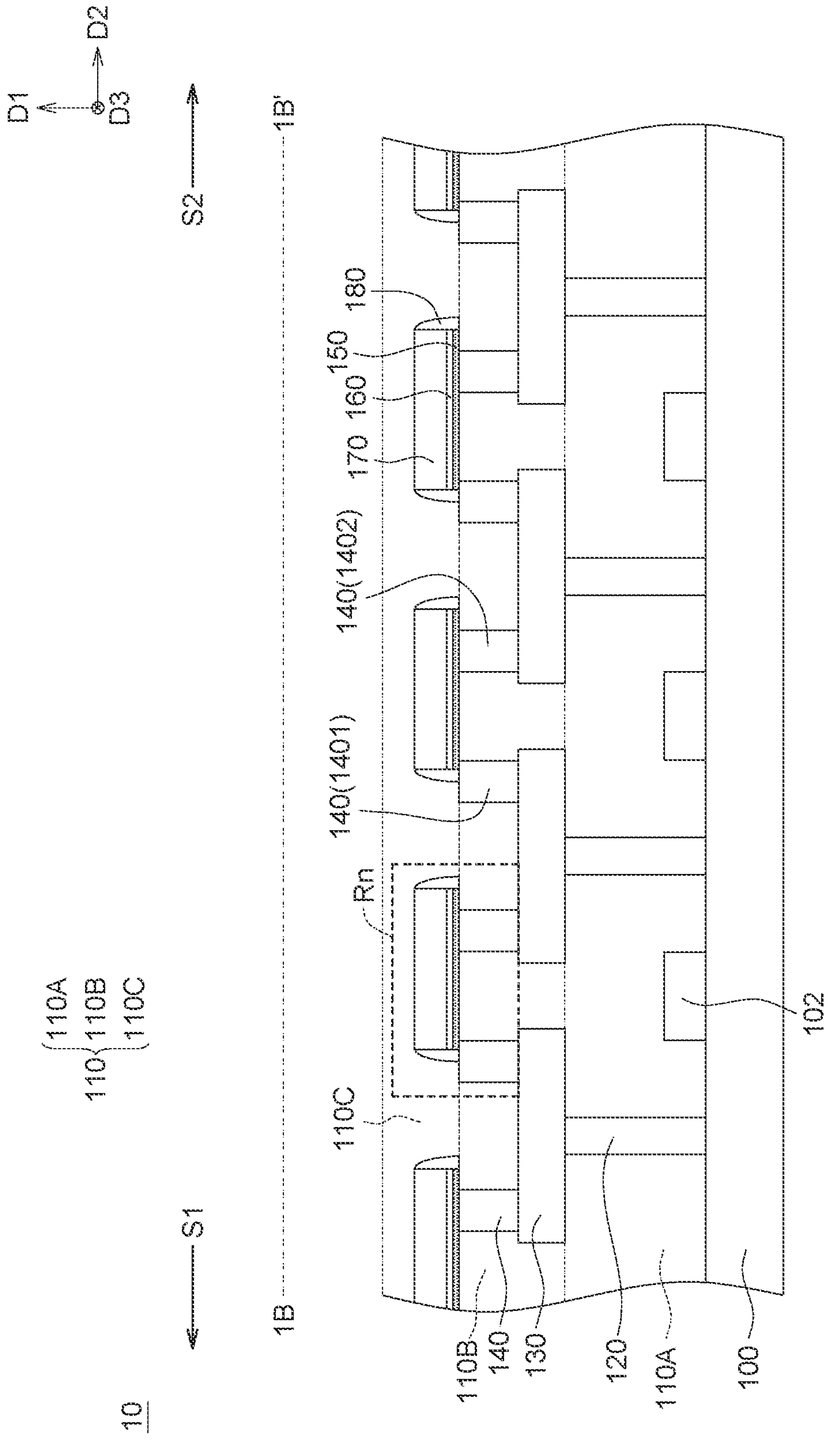
FIG. 1B shows a cross-sectional view taken along the line 1B-1B' in FIG. 1A.

FIG. 1A shows a top view of a semiconductor device 10 according to an embodiment of the present invention. FIG. 1B shows a cross-sectional view taken along the line 1B-1B' in FIG. 1A. FIG. 1A corresponds to, for example, a plane formed by a second direction D2 and a third direction D3. FIG. 1B corresponds to, for example, a plane formed by a first direction D1 and the second direction D2. The first direction D1, the second direction D2 and the third direction D3 are different from each other, for example, perpendicular to each other, but the present invention is not limited thereto.

Please refer to FIGS. 1A and 1B at the same time. The semiconductor device 10 comprises a substrate 100, a plurality of gate structures 102, a plurality of resistors Rn, a plurality of contacts 120 and a plurality of bottom conductive layers 130 electrically connected to the substrate 100 and the resistors Rn, and an interlayer dielectric layer 110. The interlayer dielectric layer 110 comprises a first interlayer dielectric layer 110A, a second interlayer dielectric layer 110B and a third interlayer dielectric layer 110C sequentially disposed on the substrate 100. The resistors Rn overlapping each other in the second direction D2 are electrically connected to each other, for example, forming a same resistor string (such as resistor string ST1) through the bottom conductive layers 130, and electrically connected to the substrate 100 through corresponding contacts 120. The resistor strings (e.g., resistor strings ST1 and ST2) can be separated from each other in a third direction D3 and share the gate structures 102. The semiconductor device 10 has a first side S1 and a second side S2 opposite to the first side S1. The first side S1 is, for example, opposite to the second side S2 along the second direction D2.

As shown in FIG. 1B, the contacts 120 are disposed on the substrate 100 and respectively extend along the first direction D1, for example, passing through the first interlayer dielectric layer 110A along the first direction D1 and electrically contacting the substrate 100. Regions of the substrate 100 adjacent to the contacts 120 can be used as source regions or drain regions (not shown). The gate structures 102 are staggered from each other in the second direction D2 and arranged on the substrate 100. The gate structures 102 may serve as word lines. The contacts 120 are staggered from each other in the second direction D2 and the third direction D3 and arranged on the substrate 100. Each of gate structures 102 extends along a third direction D3. The contacts 120 and the gate structures 102 are separated from each other in the first direction D1 without overlapping, and there is a gap between the adjacent contact 120 and gate structure 102 in the second direction D2. The bottom conductive layers 130 are respectively disposed on or cover the corresponding contacts 120. Each of bottom conductive layers 130 may extend along the second direction D2 in the second interlayer dielectric layer 110B. There is a gap between adjacent bottom conductive layers 130 in the second direction D2. The resistors Rn are disposed on the bottom conductive layers 130, for example, between two adjacent bottom conductive layers 130.

As shown in FIGS. 1A and 1B, bottom electrodes 140 are formed on the bottom conductive layers 130, and extend along the first direction D1 in the second interlayer dielectric layer 110B to electrically contact the bottom conductive layers 130. In the present embodiment, the bottom electrodes 140 extend from top surfaces of the second interlayer dielectric layers 110B to the top surfaces of the bottom conductive layers 130, and the top surfaces of the bottom electrodes 140 and the top surfaces of the second interlayer dielectric layer 110B can be aligned in the second direction D2 is, but the present invention is not limited thereto. Two adjacent bottom electrodes 140 overlapping with the same bottom conductive layer 130 in the first direction D1 are respectively formed on positions adjacent to the first side S1 and the second side S2 of the same bottom conductive layer 130. The bottom conductive layers 130 overlapping in the second direction D2 can be regarded as the bottom conductive layers 130 of the same resistor string; the bottom electrodes 140 overlapping in the second direction D2 can be regarded as the bottom electrodes 140 of the same resistor string.

According to the present embodiment, each of resistors Rn may include two bottom electrodes 140 adjacent to each other, a resistive layer 150, a protective layer 160, a top electrode 170 and a conductive sidewall 180, as shown in FIGS. 1A and 1B shown. The resistive layer 150 is disposed on the two bottom electrodes 140 adjacent to each other. The protective layer 160 is disposed on the resistive layer 150. The top electrode 170 is disposed on the resistive layer 150 and the protective layer 160. The conductive sidewall 180 is disposed on the two bottom electrodes 140 adjacent to each other and surrounds and directly contacts the resistive layer 150, the protective layer 160 and the top electrode 170. Moreover, the conductive sidewall 180 is electrically connected to a bottom electrode 140 of the two bottom electrodes 140 adjacent to each other. For example, the two bottom electrodes 140 adjacent to each other comprises a bottom electrode 1401 closer to the first side S1 and a bottom electrode 1402 closer to the second side S2. The conductive sidewall 180 directly contacts (and electrically contacts) the bottom electrode 140 (i.e. bottom electrode 1401) that is closer to the first side S1 in the two bottom electrodes 140 adjacent to each other. The top electrode 170 extends (for example, continuously extends) along the second direction D2 on the two bottom electrodes 140 adjacent to each other, the resistive layer 150 and the protective layer 160.

In detail, in the same resistor Rn, the top electrode 170, the resistive layer 150, and the protective layer 160 can overlap the two bottom electrodes 140 adjacent to each other in the first direction D1, and the two bottom electrodes 140 adjacent to each other overlap the positions of the top electrode 170, the resistive layer 150 and the protective layer 160 adjacent to the first side S1 and the second side S2 in the first direction D1, respectively. In other words, each of the top electrode 170, the resistive layer 150 and the protective layer 160 overlapping each other in the first direction D1 extends continuously above two top electrodes 170 adjacent to each other along the second direction D2. For example, each of the top electrode 170, the resistive layer 150 and the protective layer 160 overlapping each other in the first direction D1 can continuously extend along the second direction D2 from a bottom electrode 140 in the two bottom electrodes 140 closer to the first side S1 to a bottom electrode 140 in the two bottom electrodes 140 closer to the second side S2. A contact area between the bottom electrode 140 in the two bottom electrodes 140 closer to the first side S1 and the resistive layer 150 (i.e. a contact area between a top surface of bottom electrode 1401 and the resistive layer 150) is smaller than a contact area between the bottom electrode 140 in the two bottom electrodes 140 closer to the second side S2 and the resistive layer 150 (i.e. a contact area between a top surface of bottom electrode 1402 and the resistive layer 150). The top surface of the bottom electrode 140 adjacent to the second side S2 is, for example, completely covered by the resistive layer 150 (that is, the top surface is completely in contact with the resistance layer 150). A first portion 1401*a* of the top surface of the bottom electrode 140 adjacent to the first side S1 is, for example, covered by the resistive layer 150 and the conductive sidewall 180 (that is, in contact with the resistive layer 150 and the conductive sidewall 180); a second portion 1401*b* of the top surface of the bottom electrode 140 adjacent to the first side S1 is, for example, exposed from the resistive layer 150 and the conductive sidewall 180 and is covered by the third interlayer dielectric layer 110C (that is, in contact with the third interlayer dielectric layer 110C). The first portion 1401*a* of the top surface of the bottom electrode 140 adjacent to the first side S1 is connected to the second portion 1401*b* of the top surface of the bottom electrode 140 adjacent to the first side S1. However, the present invention is not limited thereto. In other embodiments, the top surface of the bottom electrode 140 (i.e. bottom electrode 1401) adjacent to the first side S1 is completely covered by the resistive layer 150 and the conductive sidewall 180 (that is, in contact with the resistive layer 150 and the conductive sidewall 180), and is not in contact with the third interlayer dielectric layer 110C.

In other words, the bottom electrode 140 (i.e. bottom electrode 1401) in the two bottom electrodes 140 closer to the first side S1 at least partially overlaps the conductive sidewall 180 in the first direction D1, and directly contacts the conductive sidewall 180; The bottom electrode 140 (i.e. bottom electrode 1402) in the two bottom electrodes 140 closer to the second side S2 is separated from the conductive sidewall 180 in the first direction D1 (i.e., does not overlap the conductive sidewall 180), and is not in direct contact with the conductive sidewall 180. In the cross-sectional view formed by the first direction D1 and the second direction D2 (for example, FIG. 1B), the conductive sidewall 180 has a D-shaped structure. In the resistor Rn, for example, the current path flows from the bottom electrode 140 (i.e. bottom electrode 1401) in the two bottom electrodes 140 closer to the first side S1 to the conductive side wall 180, then flows from the conductive side wall 180 to the top electrode 170, and then flows from the top electrode 170 to the bottom electrode 140 (i.e. bottom electrode 1402) in the two bottom electrodes 140 closer to the second side S2.

According to an embodiment, two resistors Rn adjacent to each other are electrically connected to each other through a bottom conductive layer 130. Bottom surfaces of the two bottom electrodes 140 adjacent to each other in the same resistor Rn are respectively electrically connected to (for example, in direct contact) two bottom conductive layers 130 adjacent to each other, and the two bottom conductive layers 130 adjacent to each other are respectively electrically connected to (for example, in direct contact) two contacts 120 adjacent to each other.

In other embodiments, the resistor Rn may not include the protective layer 160, and the resistor layer 150 may directly contact the top electrode 170.

Figure 2A:
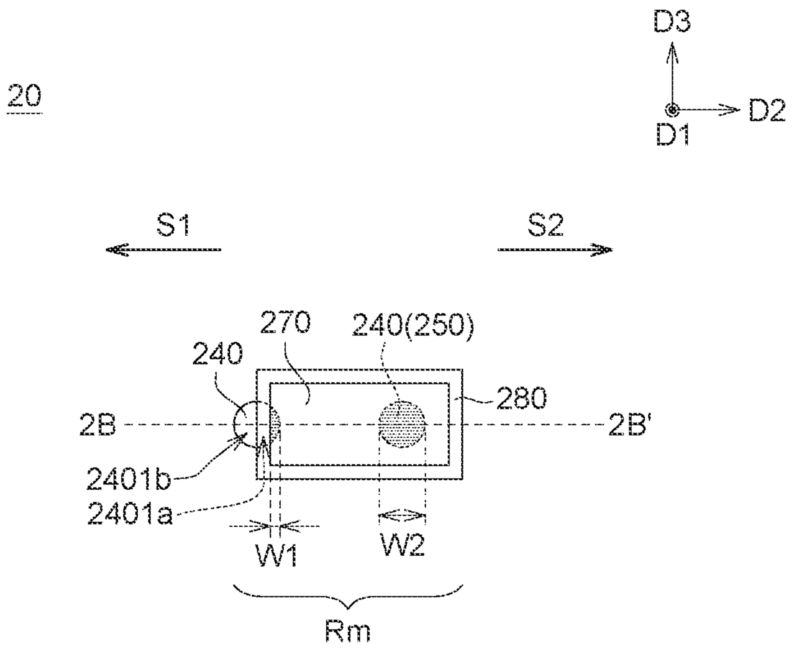
FIG. 2A shows a top view of one resistor of a semiconductor device according to another embodiment of the present invention.
Figure 2B:
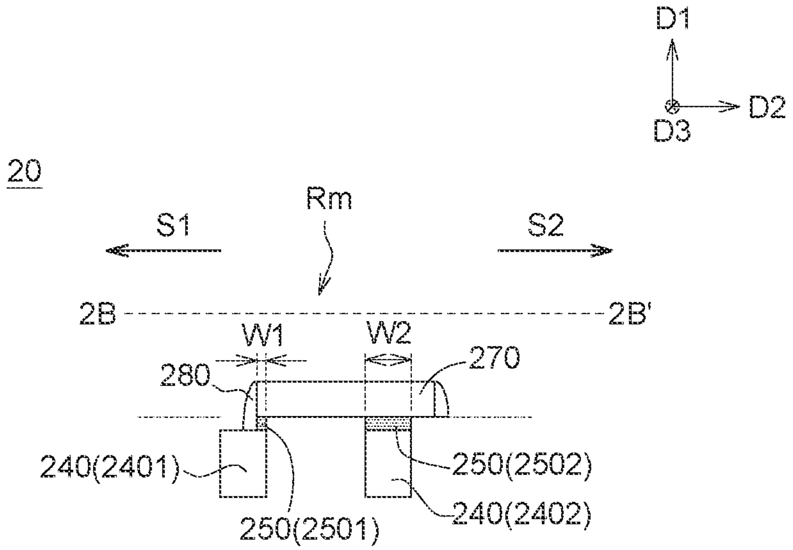
FIG. 2B shows a cross-sectional view taken along the line 2B-2B' in FIG. 2A.

FIG. 2A shows a top view of one resistor Rm of a semiconductor device 20 according to another embodiment of the present invention. FIG. 2B shows a cross-sectional view taken along the line 2B-2B' in FIG. 2A. The semiconductor device 20 has portions of the same structure as the semiconductor device 10. The difference between the semiconductor device 20 and the semiconductor device 10 lies in the difference between the resistor Rm and the resistor Rn. Other similar structures are omitted from illustration. The semiconductor device 20 also includes a plurality of resistors Rm, the resistor Rm may be similar to the resistor Rn, wherein one of the differences between the resistor Rm and the resistor Rn is that the resistive layer 250 is different from the resistive layer 150, and the resistor Rm does not include protective layer 160. Similarly, the resistors Rm overlapping each other in the second direction D2 can form a resistor string through the corresponding plurality of bottom conductive layers 130, and be electrically connected to the substrate 100 through the plurality of contacts 120.

Please refer to FIGS. 2A and 2B at the same time. Each of resistors Rm may include two bottom electrodes 240 adjacent to each other, a resistive layer 250, a top electrode 270 and a conductive sidewall 280. The resistive layer 250 is disposed on the two bottom electrodes 240 adjacent to each other, the top electrode 270 is disposed on the resistive layer 250, and the conductive sidewall 280 is disposed on the two bottom electrodes 240 adjacent to each other, surrounds and directly contacts the resistive layer 250 and top electrode 270. Moreover, the conductive sidewall 280 is electrically connected to the top electrode 270 and a bottom electrode 240 of the two bottom electrodes 240 adjacent to each other. For example, the two bottom electrodes 240 adjacent to each other include a bottom electrode 2401 closer to the first side S1 and a bottom electrode 2402 closer to the second side S2. The conductive sidewall 280 directly contacts (and electrically contacts) the bottom electrode 240 (i.e., the bottom electrode 2401) closer to the first side S1 in the two bottom electrodes 240 adjacent to each other. The resistive layer 250 may include a first resistive layer 2501 adjacent to the first side S1 and a second resistive layer 2502 adjacent to the second side S2. There is a gap between the first resistive layer 2501 and the second resistive layer 2502 in the second direction D2. That is, the first resistive layer 2501 and the second resistive layer 2502 are not connected to each other, and are respectively in direct contact with the bottom electrode 240 (i.e. bottom electrode 2401) closer to the first side S1 in the two bottom electrodes 240 adjacent to each other and the bottom electrode 240 (i.e., bottom electrode 2402) closer to the second side S2 in the two bottom electrodes 240 adjacent to each other. For example, a width W1 of the first resistive layer 2501 in the second direction D2 is smaller than a width W2 of the second resistive layer 2502 in the second direction D2. The top electrode 270 extends (for example, continuously extends) on the two bottom electrodes 240 adjacent to each other and the resistive layer 250 along the second direction D2.

In detail, in the same resistor Rm, the top electrode 270 and the resistive layer 250 can overlap the two bottom electrodes 140 adjacent to each other in the first direction D1, and the two bottom electrodes 240 adjacent to each other overlap the top electrode 270 and the resistive layer 250 in the first direction D1 at positions adjacent to the first side S1 and the second side S2, respectively. The top electrode 270 extends continuously above the two top electrodes 270 adjacent to each other along the second direction D2, and also continuously extends above the first resistive layer 2501 and the second resistive layer 2502. For example, the top electrode 270 may extend continuously from the bottom electrode 240 closer to the first side S1 and the first resistive layer 2501 to the bottom electrode 240 closer to the second side S2 and the second resistive layer 2502 along the second direction D2. A contact area between the bottom electrode 240 in the two bottom electrodes 240 closer to the first side S1 and the resistive layer 250 (i.e., the contact area between the top surface of the bottom electrode 2401 and the first resistive layer 2501) is smaller than a contact area between the bottom electrode 240 in the two bottom electrodes 240 closer to the second side S2 and the resistive layer 250 (i.e., the contact area between the top surface of the bottom electrode 2402 and the second resistive layer 2502). The top surface of the bottom electrode 240 adjacent to the second side S2 is, for example, completely covered by the resistive layer 250 (e.g. second resistive layer 2501) (that is, the top surface is completely in contact with the second resistive layer 2501 of the resistive layer 250). A first portion 2401*a* of the top surface of the bottom electrode 240 adjacent to the first side S1 is, for example, covered by the resistive layer 250 and the conductive sidewall 180 (that is, in contact with the resistive layer 250 and the conductive sidewall 280). A second portion 2401*b* of the top surface of the bottom electrode 240 adjacent to the first side S1 is, for example, exposed from the resistive layer 250 and the conductive sidewall 280, and is covered by the interlayer dielectric layer 110 (e.g., the second interlayer dielectric layer 110B) (that is, contacts the second interlayer dielectric layer 110B). The first portion 2401*a* of the top surface of the bottom electrode 240 adjacent to the first side S1 is connected to the second portion 2401*b* of the top surface of the bottom electrode 240 adjacent to the first side S1. However, the present invention is not limited thereto. In other embodiments, the top surface of the bottom electrode 240 (that is, the bottom electrode 2401) adjacent to the first side S1 is completely covered by the resistive layer 250 and the conductive sidewall 280 (that is, in contact with the resistive layer 250 and the conductive sidewall 280), and is not in contact with the second interlayer dielectric layer 110B.

In other words, the bottom electrode 240 in the two bottom electrodes 240 closer to the first side S1 at least partially overlaps the conductive sidewall 280 in the first direction D1, and directly contacts the conductive sidewall 280. The bottom electrode 240 in the two bottom electrodes 240 closer to the second side S2 is separated from the conductive sidewall 280 in the first direction D1 (i.e., does not overlap the conductive sidewall 280), and is not in direct contact with the conductive sidewall 280. In the cross-sectional view formed by the first direction D1 and the second direction D2 (for example, FIG. 2B), the conductive sidewall 280 has a D-shaped structure. In the resistor Rm, for example, the current path flows from the bottom electrode 240 (i.e., the bottom electrode 2401) closer to the first side S1 in the two bottom electrodes 240 into the conductive sidewall 280, and then flows from the conductive sidewall 280 into the top electrode 270, and then flows from the top electrode 270 into the bottom electrode 240 (i.e., the bottom electrode 2402) closer to the second side S2 in the two bottom electrodes 240.

According to an embodiment, two adjacent resistors Rm are electrically connected to each other through a bottom conductive layer 130. In the same resistor Rm, the bottom surfaces of two bottom electrodes 240 adjacent to each other are respectively electrically connected to (for example, direct contact) two bottom conductive layers 130 adjacent to each other, and the two bottom conductive layers 130 adjacent to each other are electrically connected to (for example, direct contact) to two contacts 120 adjacent to each other, respectively.

FIGS. 3A to 3F illustrate a method for manufacturing a semiconductor device 10 according to an embodiment of the present invention.

Figure 3A:
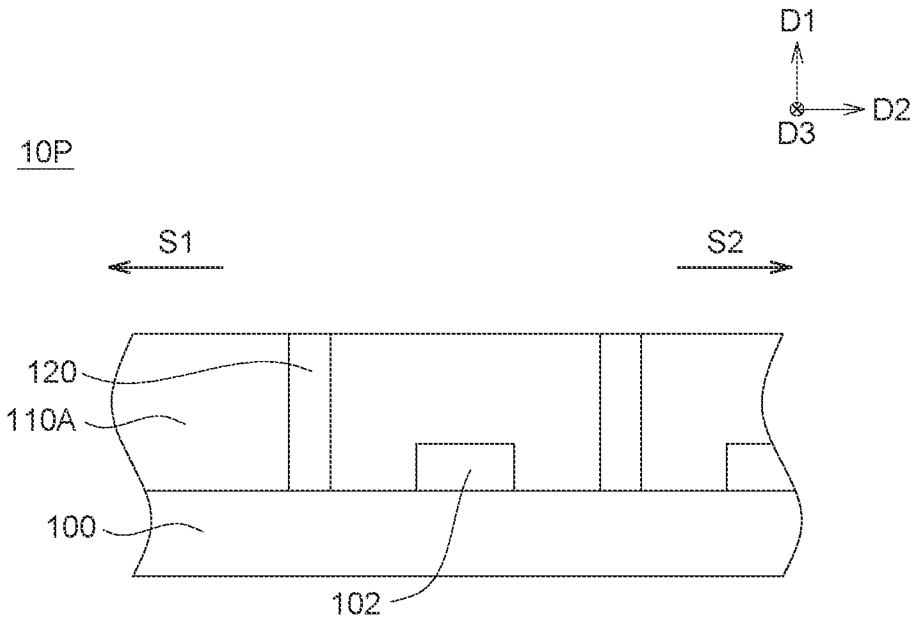
FIGS. 3A to 3F show a method for manufacturing a semiconductor device according to an embodiment of the present invention.

Referring to FIG. 3A, an initial structure 10P is provided. The initial structure 10P includes a substrate 100, a first interlayer dielectric layer 110A, a plurality of contacts 120 and a plurality of gate structures 102. The first interlayer dielectric layer 110A is disposed on the substrate 100, and the contacts 120 respectively pass through the first interlayer dielectric layer 110A along the first direction D1 and electrically contact the substrate 100. A region of the substrate 100 adjacent to the contact 120 can be used as a source region or a drain region (not shown). The gate structures 102 are staggered from each other in the first direction D1 and arranged on the substrate 100. The contacts 120 are staggered from each other in the first direction D1 and arranged on the substrate 100. Each of the gate structures 102 extends along a third direction D3. The contacts 120 and the gate structures 102 are separated from each other in the first direction D1 without overlapping, and there is a gap between the adjacent contact 120 and the gate structure 102 in the second direction D2.

Figure 3B:
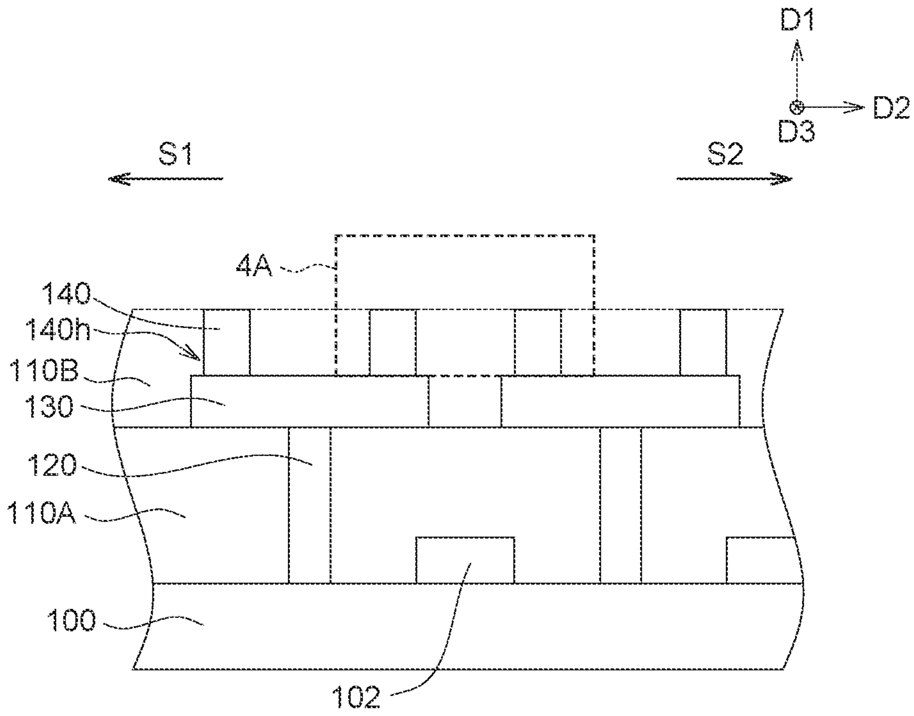

Referring to FIG. 3B, after forming a plurality of bottom conductive layers 130 on the initial structure 10P shown in FIG. 3A, a second interlayer dielectric layer 110B covering the bottom conductive layers 130 is formed. Thereafter, forming a plurality of via holes 140*h* passing through the second interlayer dielectric layer 110B along the first direction D1 and exposing portions of the bottom conductive layers 130, and filling the via holes 140*h* with a conductive material to form bottom electrodes 140. The bottom conductive layers 130 cover the corresponding contacts 120, respectively. Each of bottom conductive layers 130 extends along the second direction D2. There is a gap between adjacent bottom conductive layers 130 in the second direction D2. Two bottom electrodes 140 adjacent to each other overlapping the same bottom conductive layer 130 in the first direction D1 are respectively formed on positions adjacent to the first side S1 and the second side S2 of the same bottom conductive layer 130. The bottom conductive layers 130 overlapping in the second direction D2 can be regarded as the bottom conductive layers 130 of the same resistor string; the bottom electrodes 140 overlapping in the second direction D2 can be regarded as the bottom electrodes 140 of the same resistor string.

Figure 3C:
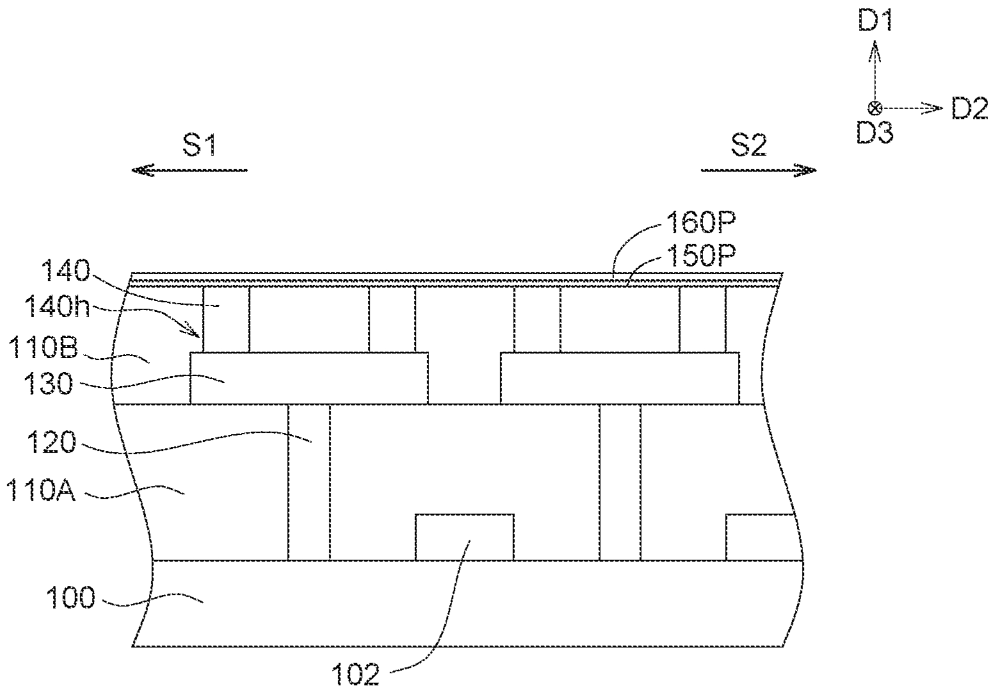

Referring to FIG. 3C, a resistive material layer 150P and a protective material layer 160P are sequentially formed on the second interlayer dielectric layer 110B and the bottom electrodes 140 (the structure as shown in FIG. 3B) by the deposition process. The resistive material layer 150P and the protective material layer 160P cover top surfaces of the second interlayer dielectric layer 110B and the bottom electrodes 140, the protective material layer 160P covers the resistive material layer 150P, and the resistive material layer 150P directly contacts the bottom electrode 140. The method for forming the resistive material layer in the present application is not limited to the deposition process, but may be formed by oxidation process or other suitable process. In other embodiments, the resistor Rn may not include the protective layer 160, so the protective material layer 160P may not be formed on the resistive material layer 150P (not shown).

Figure 3D:
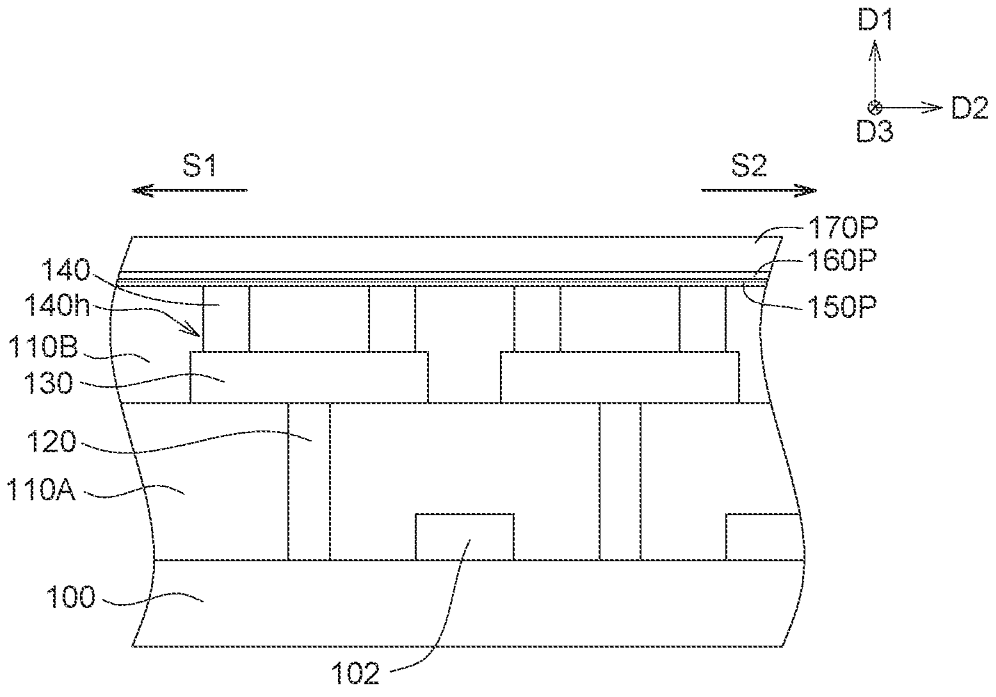

Referring to FIG. 3D, a conductive material layer 170P is formed on the resistive material layer 150P and the protective material layer 160P (the structure as shown in FIG. 3C). The conductive material layer 170P, for example, extends along the second direction D2 and covers the resistive material layer 150P and the protective material layer 160P. In other embodiments, the resistor Rn may not include the protective layer 160, so the protective material layer 160P may not be formed, and the conductive material layer 170P may be directly formed on the resistive material layer 150P (not shown).

Figure 3E:
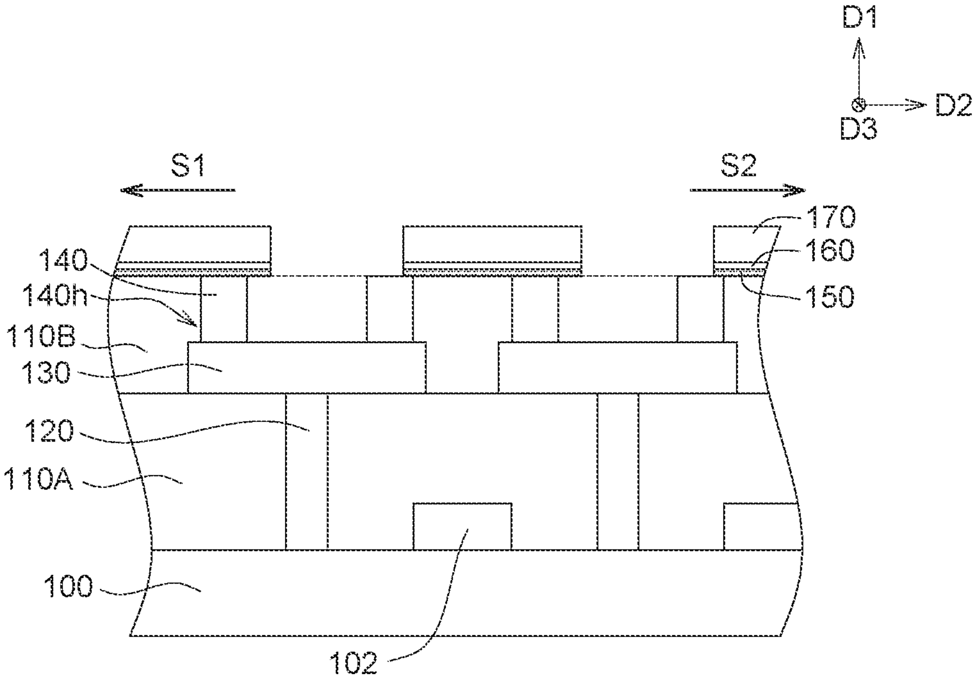

Please refer to FIG. 3E, the conductive material layer 170P, the resistive material layer 150P and the protective material layer 160P (structure as shown in FIG. 3D) are respectively patterned into a plurality of top electrodes 170, a plurality of resistive layers 150 and a plurality of protective layers 160. The corresponding top electrode 170, resistive layer 150, and protective layer 160 may overlap two bottom electrodes 140 adjacent to each other in the first direction D1, and the two bottom electrodes 140 adjacent to each other overlap the positions of the top electrode 170, the resistive layer 150 and the passivation layer 160 adjacent to the first side S1 and the second side S2 in the first direction D1, respectively. The first side S1 and the second side S2 are opposite to each other along the second direction D2. In other words, each of the top electrodes 170, the resistive layer 150 and the protective layer 160 overlapping each other in the first direction D1 extends continuously above the two the bottom electrodes 140 along the second direction D2. For example, each of the top electrode 170, the resistive layer 150 and the protective layer 160 overlapping each other in the first direction D1 may extend continuously from the bottom electrode 140 adjacent to the first side S1 to the bottom electrode 140 adjacent to the second side S2 along the second direction D2.

Figure 3F:
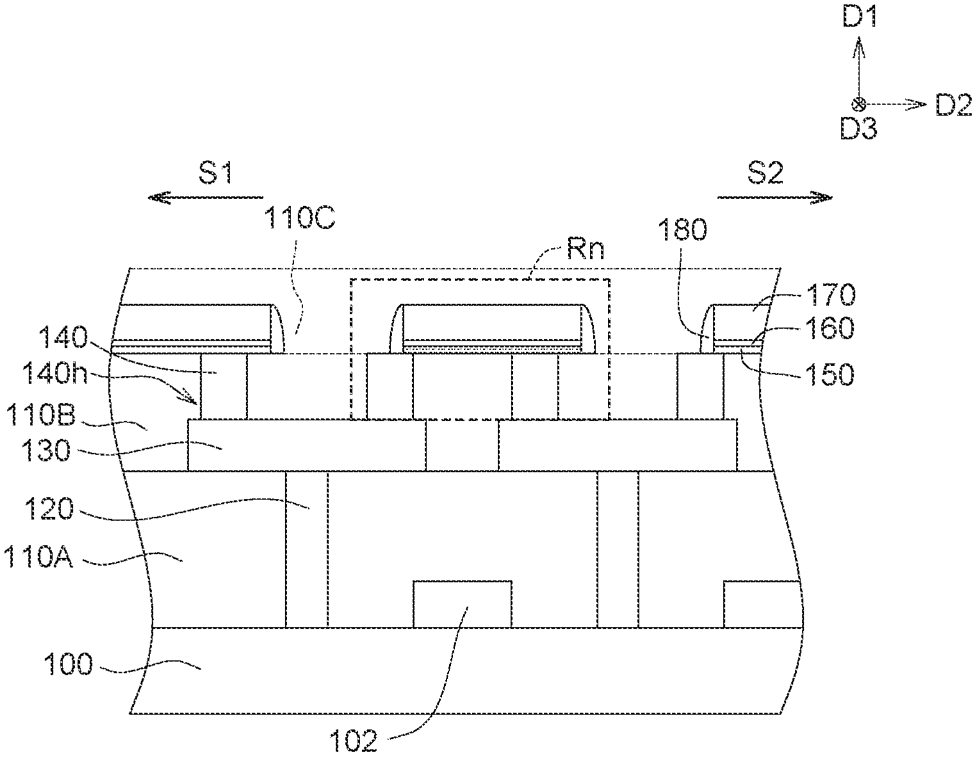

Referring to FIG. 3F, a plurality of conductive sidewalls 180 are formed around the top electrodes 170, the resistive layers 150 and the protective layers 160 (structure as shown in FIG. 3E), and then a third interlayer dielectric layer 110C is formed on the conductive sidewalls 180 and the top electrodes 170 A. Each of the conductive sidewalls 180 surrounds and directly contacts the corresponding top electrode 170, the resistive layer 150 and the protective layer 160. The conductive sidewall 180 is in electrical contact with the top surface of the bottom electrode 140 adjacent to the first side S1. For example, the method for fabricating the conductive sidewall 180 may include the following steps: conformally forming a conductive film (not shown) on the second interlayer dielectric layer 110B and the top electrode 170, then removing portions of the conductive film (not shown) by an etching process, and the remaining conductive film (not shown) around the top electrode 170, the resistive layer 150 and the protective layer 160 becomes the conductive sidewall 180. The protective layer 160 may include a conductive material, and may be used for protecting the underlying resistive layer 150 from being damaged by subsequent processes.

The semiconductor device 10 as shown in FIGS. 1A and 1B can be formed through the manufacturing methods as shown in FIGS. 3A to 3F in sequence. It should be understood that the method for manufacturing the semiconductor device 10 is not limited thereto. For example, it may include other suitable manufacturing methods.

FIGS. 4A to 4E show a method for manufacturing a semiconductor device 20 according to another embodiment of the present invention. One of the differences between the manufacturing methods of the semiconductor device 20 and the semiconductor device 10 is in that the method for forming a resistive layer 150 is different, and other same or similar parts will not be described in detail.

Figure 4A:
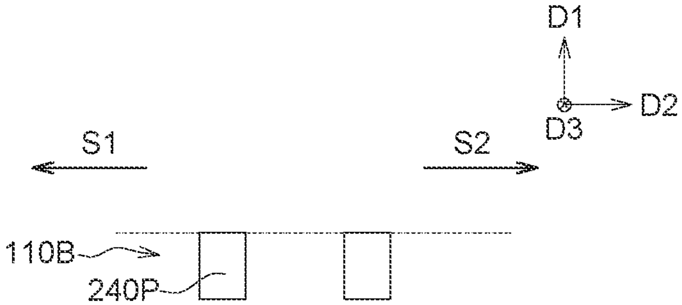
FIGS. 4A to 4E show a method for manufacturing a semiconductor device according to another embodiment of the present invention.

FIGS. 4A to 4E mainly describe the formation of the resistive layer 250, and only show the formation steps of a resistor Rm (corresponding to the resistor Rn as shown in FIG. 3F). FIG. 4A corresponds to the formation stage of the portion 4A as shown in FIG. 3B. That is, the formation method, position, shape and property of the electrode material 240P in FIG. 4A are the same as the formation method, position, shape and property of the bottom electrode 140 in FIG. 3B, other identical elements are omitted from illustration.

Referring to FIG. 4A, a plurality of electrode materials 240P are formed in the second interlayer dielectric layer 110B, disposed on the bottom conductive layer 130 (not shown) and electrically contacting the corresponding bottom conductive layer 130 (not shown).

Figure 4B:
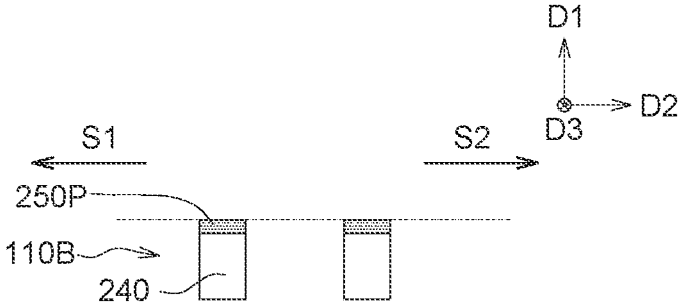

Referring to FIG. 4B, a top surface of each of the electrode materials 240P is oxidized into a resistive material layer 250P by an oxidation process, and the electrode material 240P that has not been oxidized becomes a bottom electrode 240. For example, when the electrode material 240P includes a first conductive component (e.g., tungsten), the resistive material layer 250P may include an oxide of the first conductive component (e.g., oxide of tungsten). The top surface of the resistive material layer 250P is, for example, aligned with the top surface of the second interlayer dielectric layer 110B along the second direction D2, and the top surface of the bottom electrode 240 may be lower than the top surface of the second interlayer dielectric layer 110B.

Figure 4C:
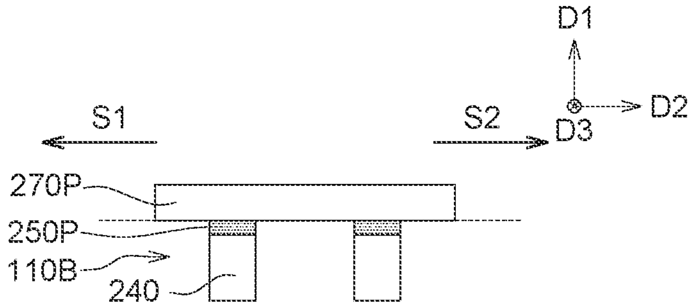

Referring to FIG. 4C, a conductive material layer 270P is formed on the resistive material layer 250P. The conductive material layer 270P, for example, extends along the second direction D2 and covers the resistive material layer 250P and the second interlayer dielectric layer 110B.

Figure 4D:
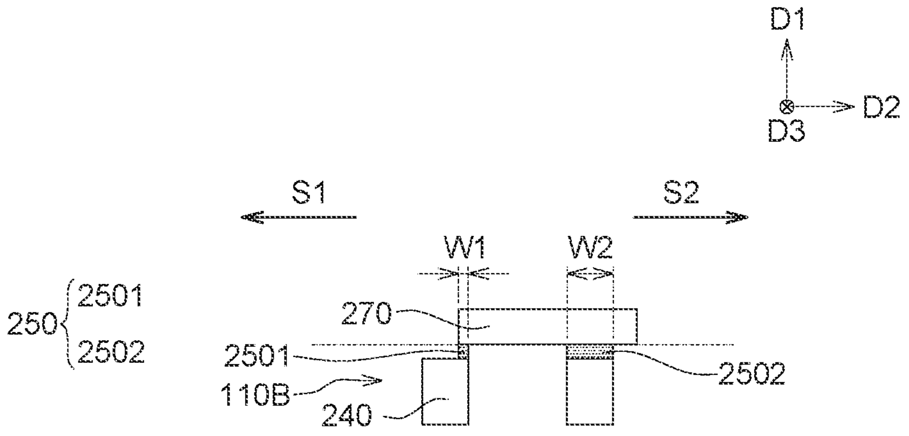

Please refer to FIG. 4D, the conductive material layer 270P and the resistive material layer 250P are patterned into a plurality of top electrodes 270 and a plurality of resistive layers 250 respectively by a patterning process. A corresponding top electrode 270 may overlap two adjacent bottom electrodes 240 and a resistive layer 250 in the first direction D1, and the two adjacent bottom electrodes 240 overlap positions of the top electrode 270 adjacent to the first side S1 and the second side S2 in the first direction D1, respectively. The first side S1 and the second side S2 are opposite to each other along the second direction D2. In detail, a resistive layer 250 may include a first resistive layer 2501 adjacent to the first side S1 and a second resistive layer 2502 adjacent to the second side S2. For example, a width W1 of the first resistive layer 2501 in the second direction D2 is smaller than a width W2 of the second resistive layer 2502 in the second direction D2.

In other words, the top electrode 270 extends continuously along the second direction D2 above the two bottom electrodes 240 and the resistive layer 250 (including the first resistive layer 2501 and the second resistive layer 2502). For example, each of the top electrodes 270 may extend continuously from the first resistive layer 2501 and the bottom electrode 240 adjacent to the first side S1 to the second resistive layer 2502 and the bottom electrode 240 adjacent to the second side S2 along the second direction D2.

Figure 4E:
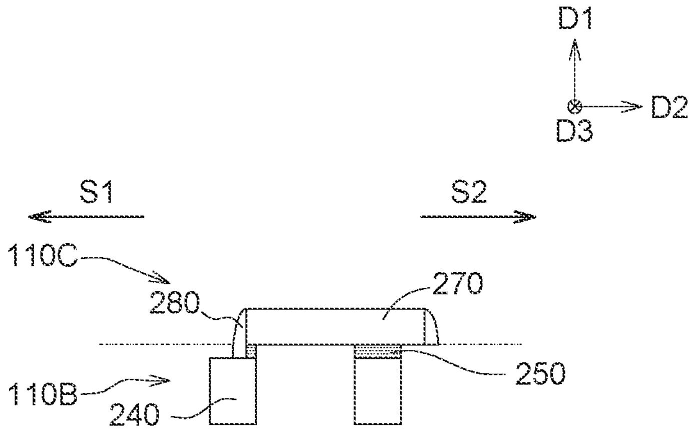

Referring to FIG. 4E, a plurality of conductive sidewalls 280 are formed around the top electrodes 270, and then a third interlayer dielectric layer 110C can be formed on the conductive sidewalls 280 and the top electrodes 270. Each of conductive sidewalls 280 surrounds and directly contacts the corresponding top electrode 270 and the resistive layer 250 (e.g., the first resistive layer 2501). The conductive sidewall 280 is in electrical contact with the top surface of the bottom electrode 240 adjacent to the first side S1. For example, the method for fabricating the conductive sidewall 280 may include the following steps: conformally forming a conductive film (not shown) on the second interlayer dielectric layer 110B, the bottom electrode 240 adjacent to the first side S1 and the top electrode 270 (structure as shown in FIG. 4D); after that, portions of the conductive film (not shown) are removed by etching process, and the remaining conductive film (not shown) around the top electrodes 270 and the resistive layers 150 becomes the conductive sidewalls 280.

The semiconductor device 20 as shown in FIGS. 2A and 2B can be formed through the manufacturing methods as shown in FIGS. 4A to 4E in sequence. It should be understood that the method for manufacturing the semiconductor device 20 is not limited thereto. For example, it may include other suitable manufacturing methods.

Figure 5A:
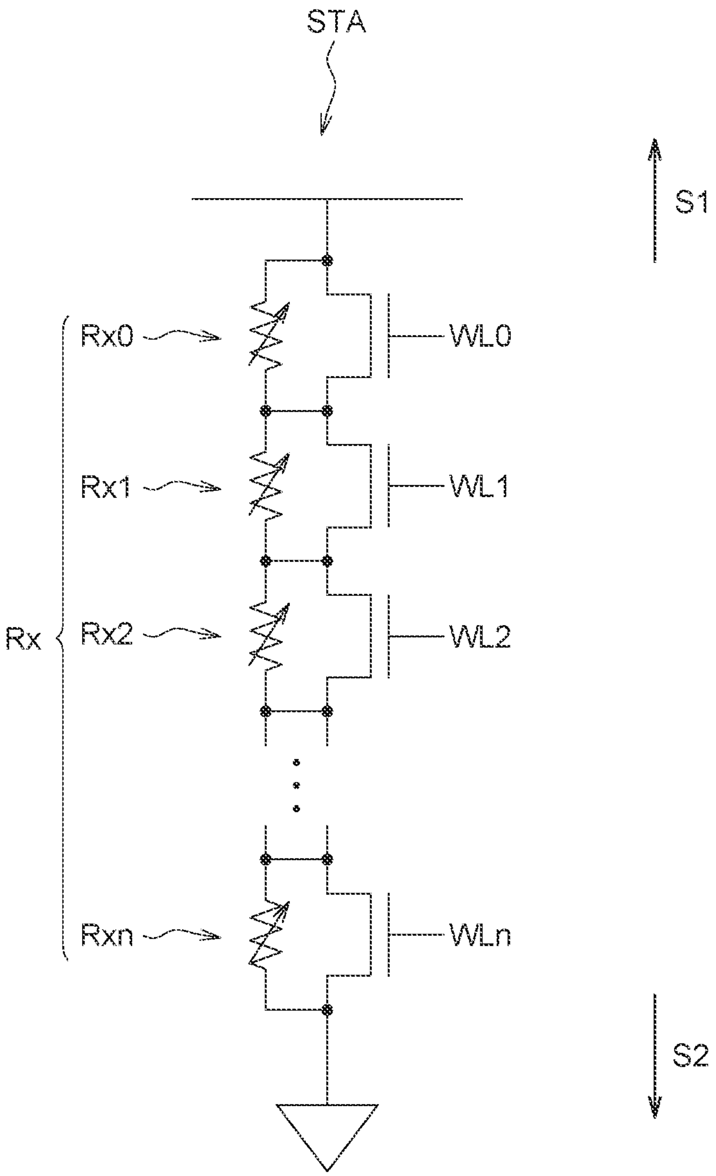
FIG. 5A shows an equivalent circuit diagram of a resistor string of a semiconductor device according to an embodiment of the present invention.
Figure 5B:
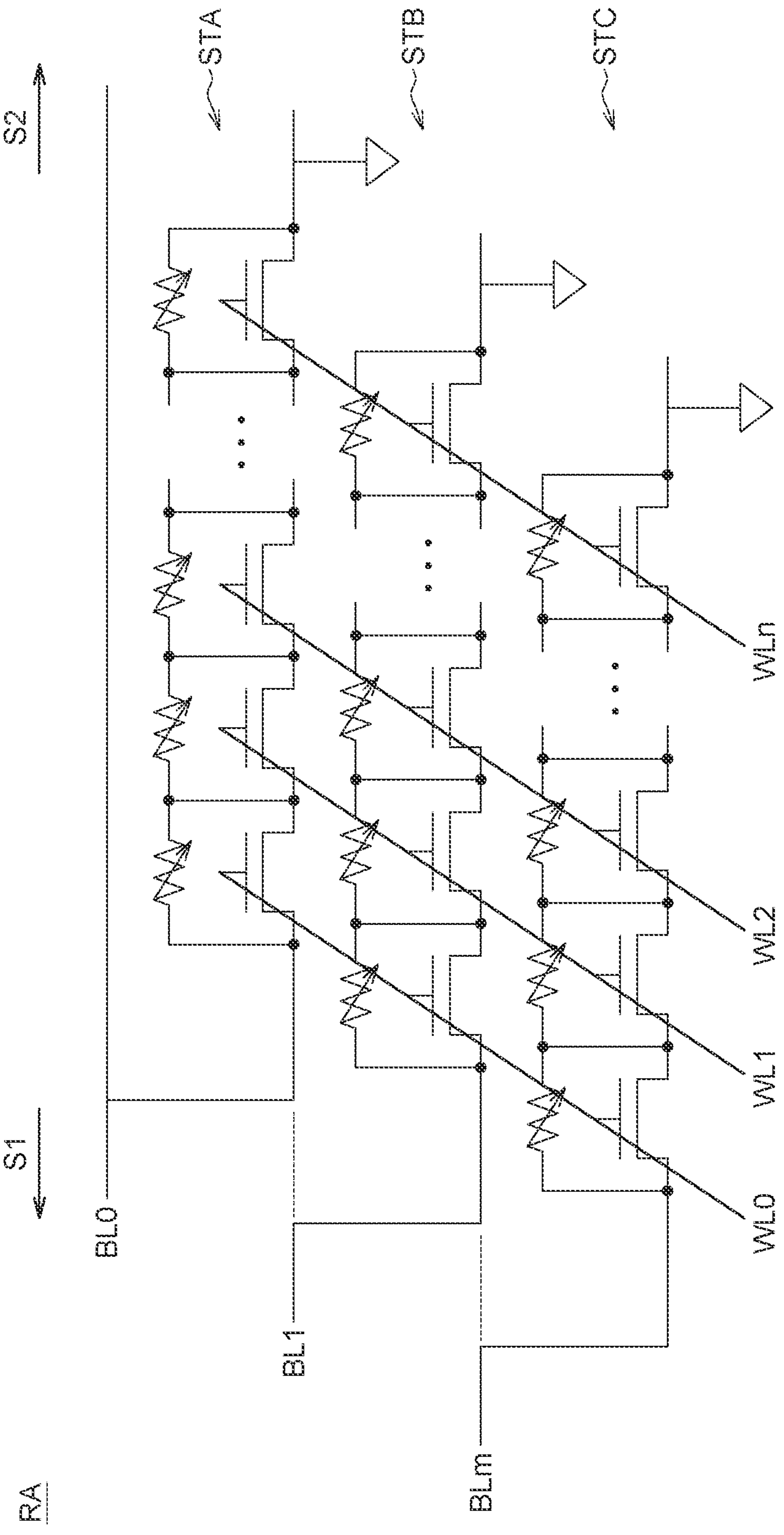
FIG. 5B shows an equivalent circuit diagram of a resistor array of a semiconductor device according to an embodiment of the present invention.

FIG. 5A shows an equivalent circuit diagram of a resistor string STA of a semiconductor device (such as the semiconductor device 10 or 20) according to an embodiment of the present invention. FIG. 5B shows an equivalent circuit diagram of a resistor array RA of a semiconductor device (such as the semiconductor device 10 or 20) according to an embodiment of the present invention.

Please refer to FIG. 5A, the resistor string STA is, for example, a resistor string ST1 or ST2 formed by a plurality of resistors Rn or a resistor string formed by a plurality of resistors Rm. The resistor string STA includes resistors Rx (including resistors Rx0, Rx1, Rx2 . . . Rxn) electrically connected to each other. In the resistor string STA, the resistor Rx0 is closer to the first side S1 than the resistor Rxn, and a terminal of the resistor string STA corresponding to the first side S1 can be electrically connected to a bit line (not shown). The resistor Rxn is closer to the second side S2 than the resistor Rx1, and a terminal of the resistor string STA corresponding to the second side S2 can be connected to the ground. For example, the resistor string STA extends along the second direction D2 and intersects with a plurality of word lines WL0, WL1, WL2 . . . WLn extending along the third direction D3, respectively. Word lines WL0, WL1, WL2 . . . WLn are, for example, connected to gate structures 102 in transistors (as shown in FIGS. 1B and 3A-3F). The word lines WL0, WL1, WL2 . . . WLn are connected in series with the gates of transistors. For example, word lines WL0, WL1, WL2 . . . WLn can be connected to the gate structures 102 (as shown in FIGS. 1B and 3A-3F) in the transistors formed in the substrate 100 (as shown in FIGS. 1B and 3A-3F). The resistors Rx0, Rx1, Rx2 . . . Rxn can respectively correspond to the word lines WL0, WL1, WL2 . . . WLn, so the resistance of a single resistor Rx can be easily measured.

Please refer to the FIG. 5B, the resistor array RA may include a plurality of resistor strings; in addition to include the resistor string STA as shown in FIG. 5A, the resistor strings STB and STC can also be included in the resistor array RA. FIG. 5B only exemplarily illustrates 3 resistor strings, but the number of resistor strings is not limited thereto. The number of resistor strings can be determined according to requirements, for example, more than 3. The extending directions of the resistor strings STA, STB, STC . . . are parallel to each other. For example, the resistor strings STA, STB, STC . . . extend along the second direction D2, respectively. The resistor strings STA, STB and STC have a similar structure, share word lines WL0, WL1, WL2 . . . WLn, and are electrically connected to different bit lines BL0, BL1 and BLm, respectively. The word lines WL0, WL1, WL2 . . . WLn extend along the third direction D3, respectively, and intersect with the extending direction of the resistor strings STA, STB and STC.

According to some embodiments, the material of the conductive sidewalls 180 and 280 may include one or an arbitrary combination of the following materials: titanium (Ti), titanium nitride (TiN), tantalum nitride (TaN), cobalt (Co), ruthenium (Ru) and other suitable conductive materials. The material of the interlayer dielectric layer 110 may include one or an arbitrary combination of the following materials: silicon oxide (SiOx), silicon nitride (SiNx), silicon oxynitride (SiON), and other suitable dielectric materials.

According to some embodiments, a thickness of the conductive sidewalls 180 and 280 may be between 25 and 2000 Angstroms (Å).

According to some embodiments, the resistors Rn, Rm, and Rx can be respectively applied to programmable resistors, such as Resistive random-access memory (ReRAM), Magnetoresistive Random Access Memory (MRAM), Phase-change memory (PCM), fuse/anti-fuse OTP cell or other suitable programmable resistors.

According to some embodiments, the semiconductor device 10 or 20 of the present application may be applied to a NAND-type ReRAM.

According to some embodiments, the semiconductor device 10 or 20 of the present application can be applied to neural network computation, for example, can be used to calculate the sum-of-voltage result and sum-of-of-resistance result.

In some comparative examples, the resistor of the semiconductor device does not include conductive sidewalls, and two adjacent bottom electrodes are respectively provided with two top electrodes separated from each other (that is, the top electrodes do not extend along the second direction above the two bottom electrodes adjacent to each other), so it is necessary to additionally form two vias disposed on the two top electrodes and a top conductive layer disposed on the two vias, so that the two bottom electrodes can be electrically connect to each other through the two vias and the top conductive layer to form a resistor string. However, due to the need to additionally form two vias and one top conductive layer, more processes are required, for example, more photomasks and lithography processes are required, which will increase the time and cost. In contrast. Since the resistor in the semiconductor device of the present application comprises the conductive sidewall, and the top electrode extends along the second direction on two bottom electrodes adjacent to each other, there is no need to additionally form two vias and one top conductive layer to form a resistor string. Compared with the comparative example that does not include conductive sidewalls, the required number of photomasks and photolithography processes in the present application can be reduced, and time and cost can be greatly saved.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising at least one resistor, wherein the at least one resistor comprises:
- two bottom electrodes adjacent to each other;
- a resistive layer disposed on the two bottom electrodes;
- a top electrode disposed on the resistive layer; and
- a conductive sidewall surrounding the top electrode and being electrically connected to the top electrode and one of the two bottom electrodes;
- wherein the top electrode overlaps the two bottom electrodes in a first direction, and extends above the two bottom electrodes along a second direction different from the first direction.

2. The semiconductor device according to claim 1, wherein the top electrode continuously extends above the two bottom electrodes along the second direction.

3. The semiconductor device according to claim 1, wherein the semiconductor device has a first side and a second side, and the first side is opposite to the second side along the second direction.

4. The semiconductor device according to claim 3, wherein a contact area between a bottom electrode in the two bottom electrodes closer to the first side and the resistive layer is smaller than a contact area between a bottom electrode in the two bottom electrodes closer to the second side and the resistive layer.

5. The semiconductor device according to claim 3, wherein a bottom electrode in the two bottom electrodes closer to the first side directly contacts the conductive sidewall.

6. The semiconductor device according to claim 3, wherein the resistive layer comprises a first resistive layer adjacent to the first side and a second resistive layer adjacent to the second side, and a gap is formed between the first resistive layer and the second resistive layer in the second direction.

7. The semiconductor device according to claim 6, wherein a width of the first resistive layer in the second direction is smaller than a width of the second resistive layer in the second direction.

8. The semiconductor device according to claim 1, further comprising a protective layer, wherein the protective layer is disposed on the resistive layer, and the top electrode is disposed on the protective layer.

9. The semiconductor device according to claim 1, wherein a number of the at least one resistor is plural, and the resistors overlapping each other in the second direction are electrically connected to each other to form a resistor string.

10. The semiconductor device according to claim 1, further comprising a substrate;

a plurality of contacts disposed on the substrate, respectively extending along the first direction and electrically contacting the substrate;

a plurality of bottom conductive layers respectively disposed on corresponding contacts in the contacts, wherein a number of the at least one resistor is plural, and the resistors are disposed on the bottom conductive layers.

11. A method for manufacturing a semiconductor device, comprising forming at least one resistor, wherein forming steps of the at least one resistor comprises:

forming two bottom electrodes adjacent to each other;

forming a resistive layer disposed on the two bottom electrodes;

forming a top electrode disposed on the resistive layer; and forming a conductive sidewall, wherein the conductive sidewall surrounds the top electrode and is electrically connected to the top electrode and one of the two bottom electrodes;

wherein the top electrode overlaps the two bottom electrodes in a first direction, and extends above the two bottom electrodes along a second direction different from the first direction.

12. The method for manufacturing a semiconductor device according to claim 11, wherein the top electrode continuously extends above the two bottom electrodes along the second direction.

13. The method for manufacturing a semiconductor device according to claim 11, wherein the semiconductor device has a first side and a second side, and the first side is opposite to the second side along the second direction.

14. The method for manufacturing a semiconductor device according to claim 13, wherein the resistive layer comprises a first resistive layer adjacent to the first side and a second resistive layer adjacent to the second side, and a gap is formed between the first resistive layer and the second resistive layer in the second direction.

* * * * *